(12) United States Patent
Nakamura

(10) Patent No.: US 11,367,656 B2
(45) Date of Patent: Jun. 21, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 38 days.

(21) Appl. No.: 17/168,333

(22) Filed: Feb. 5, 2021

(65) Prior Publication Data

US 2021/0265209 A1 Aug. 26, 2021

(30) Foreign Application Priority Data

Feb. 20, 2020 (JP) .............................. JP2020-027385

(51) Int. Cl.
| | |
|---|---|
| H01L 21/78 | (2006.01) |
| H01L 23/544 | (2006.01) |
| B23K 26/08 | (2014.01) |
| B23K 26/02 | (2014.01) |

(52) U.S. Cl.
CPC .............. H01L 21/78 (2013.01); B23K 26/02 (2013.01); B23K 26/0861 (2013.01); H01L 23/544 (2013.01); *H01L 2223/5446* (2013.01)

(58) Field of Classification Search
CPC .................... H01L 21/78; H01L 23/544; H01L 2223/5445; B23K 26/02; B23K 26/0861
See application file for complete search history.

(56) References Cited

U.S. PATENT DOCUMENTS

2007/0111390 A1* 5/2007 Komura ............... B23K 26/009
438/460

FOREIGN PATENT DOCUMENTS

| JP | 2005021940 A | 1/2005 |
| JP | 2015072986 A | 4/2015 |

* cited by examiner

*Primary Examiner* — Mohammad M Choudhry
(74) *Attorney, Agent, or Firm* — Greer Burns & Crain Ltd.

(57) ABSTRACT

Provided is a wafer processing method for dividing a wafer having devices formed on a front side thereof into individual device chips, the front side being partitioned by a plurality of crossing division lines having a testing metal pattern formed in part thereof into a plurality of regions where the respective devices are formed. The method includes a first modified layer forming step of applying a laser beam of a wavelength having a transmitting property to the wafer with a focal point of the laser beam positioned inside the wafer at a first depth from the back side, thereby forming a first modified layer along a division line, and a second modified layer forming step of applying the laser beam with the focal point positioned at a second depth shallower than the first depth, thereby forming a second modified layer along the same division line.

2 Claims, 6 Drawing Sheets

WAFER PROCESSING METHOD

BACKGROUND OF THE INVENTION

Field of the Invention

The present invention relates to a wafer processing method for dividing a wafer having devices formed on a front side thereof into individual device chips, the front side being partitioned by a plurality of crossing division lines having a testing metal pattern formed in part thereof into a plurality of regions where the respective devices are formed.

Description of the Related Art

A wafer, which has a front side partitioned by a plurality of crossing division lines into a plurality of regions where respective devices such as integrated circuits (ICs) and large-scale integrated circuits (LSIs) are formed, is divided into individual device chips by a dicing apparatus, and the resulting device chips are used in electrical equipment such as mobile phones and personal computers.

For a case where a wafer having a testing metal pattern called test element group (TEG) formed in part of division lines is divided into individual device chips, the TEG being used for testing characteristics of devices, the following wafer processing method has been proposed (See Japanese Patent Laid-open Nos. 2015-72986 and 2005-21940, for example). The method includes a TEG removing step of destroying the TEG itself through cutting with a cutting blade or application of a laser beam from a front side of the wafer such that a circuit information section including wiring connecting the TEG and a device is removed so as not to be left afterward, and a step of forming modified layers as division starting points or division grooves by performing laser processing or dicing processing along the division lines after the TEG removing step.

SUMMARY OF THE INVENTION

In the case of dividing the wafer into individual device chips with the above-described related-art technology, it is necessary to perform, after performing the TEG removing step, a separate step of forming division starting points or division grooves in the wafer again, which may lead to poor productivity.

Accordingly, it is an object of the present invention to provide a wafer processing method that can destroy a circuit information section connected with a TEG while forming a division starting point without reducing productivity.

In accordance with an aspect of the present invention, there is provided a wafer processing method for dividing a wafer having devices formed on a front side thereof into individual device chips, the front side being partitioned by a plurality of crossing division lines having a testing metal pattern formed in part thereof into a plurality of regions where the respective devices are formed, the testing metal pattern being connected to a circuit information section. The wafer processing method includes a wafer holding step of holding the wafer having the devices formed thereon on a chuck table such that the front side of the wafer is in contact with the chuck table and a back side of the wafer is exposed, a first modified layer forming step of applying a laser beam of a wavelength having a transmitting property to the wafer with a focal point of the laser beam positioned inside the wafer at a first depth from the back side, thereby forming a first modified layer along a division line, a second modified layer forming step of applying, after the first modified layer forming step is performed, the laser beam with the focal point thereof positioned at a second depth shallower than the first depth from the back side of the wafer, thereby forming a second modified layer along the division line, and a dividing step of applying an external force to the wafer after the first and second modified layer forming steps are performed, thereby dividing the wafer into individual device chips with the first and second modified layers formed inside the wafer along the division line as a division starting point. In the second modified layer forming step, the laser beam is applied with the focal point positioned at a position where the focal point partially overlaps the first modified layer that has been formed, so that the laser beam applied in the second modified layer forming step is scattered by the first modified layer, thereby destroying the circuit information section connected to the testing metal pattern.

Preferably, the focal point of the laser beam applied in each of the first and second modified layer forming steps has a spot in a form of an ellipse, and a major axis of the ellipse is positioned to extend in a direction along the division line.

According to the present invention, it is possible to destroy a region where the circuit information section including the wiring connecting the testing metal pattern and the device to each other is formed while forming the modified layer to be used as the division starting point, which improves the productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
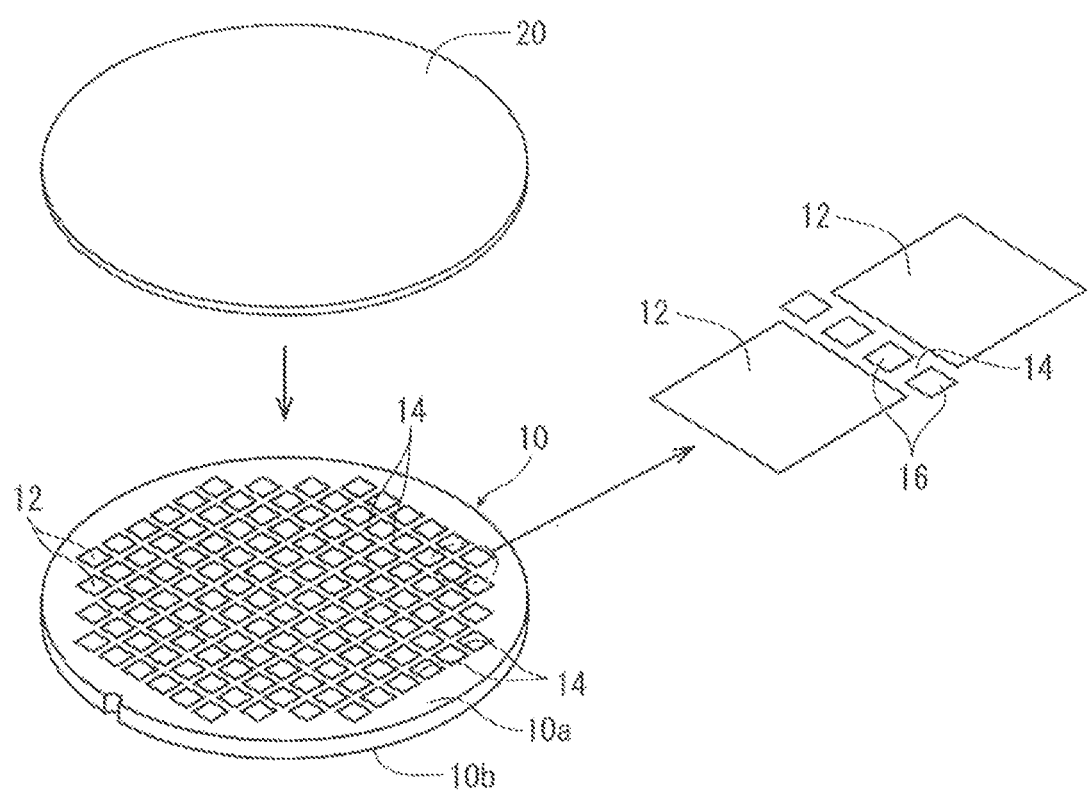
FIG. 1 is a perspective view illustrating a manner in which a protective tape is attached to a wafer to be processed in an embodiment.

A wafer processing method according to an embodiment of the present invention will be described in detail below with reference to the attached drawings. A workpiece to be processed by the wafer processing method according to the present embodiment is, for example, a wafer 10 having a front side 10a partitioned by a plurality of crossing division lines 14 into a plurality of regions where respective devices 12 are formed as illustrated in FIG. 1. The wafer 10 is, for example, a wafer including silicon (Si) and has a diameter of 300 mm and a thickness of 780 μm. Part of the division lines 14 on the front side 10a of the wafer 10 is illustrated in an enlarged manner in a right part of FIG. 1. A test element group (hereinafter referred to as a TEG) 16 that is a testing metal pattern as an electrode for testing characteristics of the devices 12 is formed on the division lines 14. The TEG 16 and the devices 12 are electrically connected to each other inside the wafer 10 at a position closer to the front side 10a to form a circuit information section.

In the present embodiment, in order to divide the wafer 10 into individual device chips, a modified layer forming step is performed for forming modified layers inside the wafer 10 along the division lines 14.

In the modified layer forming step, for example, a protective tape 20 having an outer diameter same as that of the wafer 10 and having an adhesive applied to a front side thereof is prepared. The protective tape 20, for example, includes polyvinyl chloride (PVC), polyethylene terephthalate (PET), or the like. The protective tape 20 is attached to the front side 10a of the wafer 10 to obtain an integral unit. It is to be noted that the manner of protecting the front side 10a of the wafer 10 with the protective tape 20 is not limited to the example illustrated in FIG. 1, and the wafer 10 may be, for example, positioned in an opening of an annular frame so as to be held to the frame through a protective tape having a size suitable to be attached to the frame.

Figure 2A:
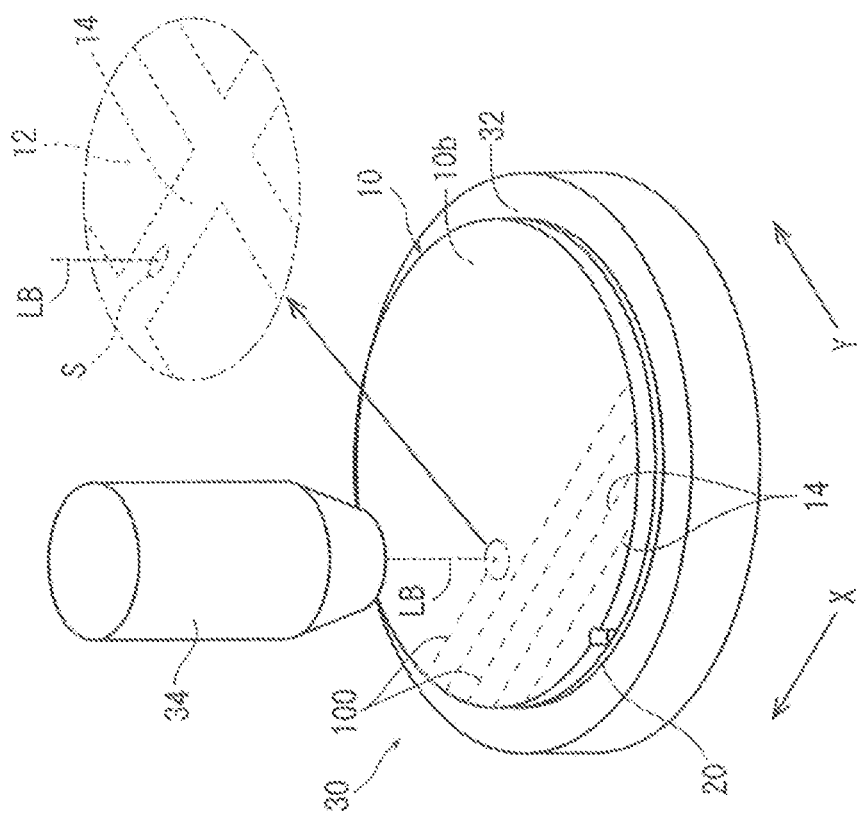
FIG. 2A is a perspective view illustrating a manner in which the wafer is placed on a chuck table of a laser processing apparatus.
Figure 2B:
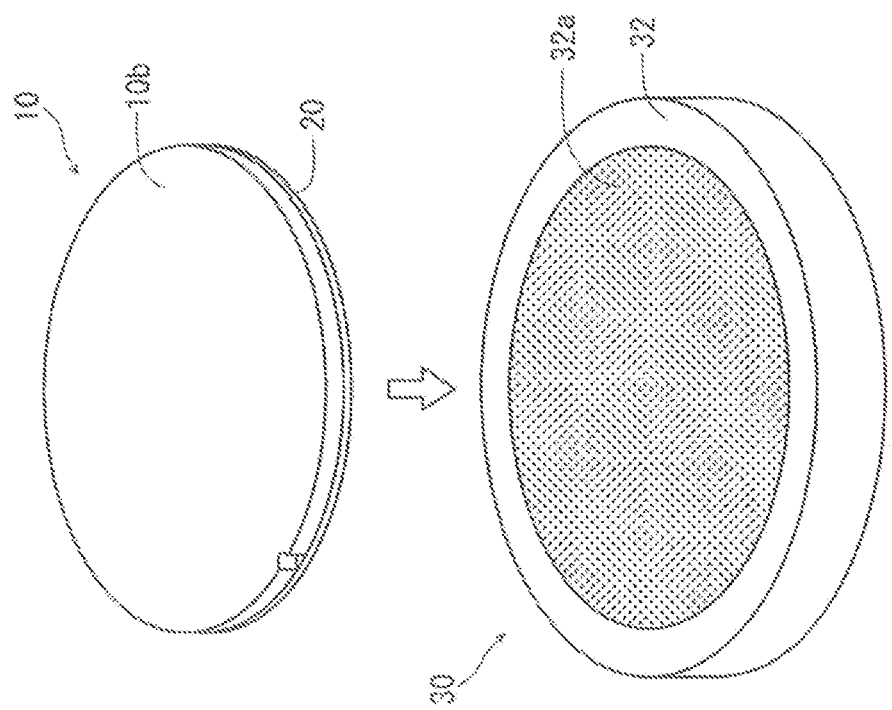
FIG. 2B is a perspective view illustrating a manner in which a modified layer forming step is performed on the wafer.

The wafer 10 integrated with the protective tape 20 as described above is transferred to a laser processing apparatus 30 partially illustrated in FIG. 2B and placed on a holding surface 32a of a chuck table 32 to be held under suction such that a back side 10b of the wafer 10 faces upward and the protective tape 20 faces downward as illustrated in FIG. 2A. The laser processing apparatus 30 includes a laser beam applying unit 34 as illustrated in FIG. 2B. The laser beam applying unit 34 has an optical system including a laser oscillator not illustrated and can apply a laser beam LB of a wavelength (1342 nm, for example) having a transmitting property to Si constituting the wafer 10. Further, the laser processing apparatus 30 can cause a moving mechanism not illustrated to move the chuck table 32 in an X-axis direction indicated by an arrow X and in a Y-axis direction indicated by an arrow Y, and also can rotate the chuck table 32.

After the wafer 10 is held on the chuck table 32, an alignment step is performed using an imaging unit not illustrated, so that the division lines 14 formed on the front side 10a of the wafer 10 are detected from the back side 10b. The imaging unit includes, for example, infrared radiation means and an infrared charge-coupled device (CCD) and can image the front side 10a of the wafer 10 in a transmissive manner from the back side 10b.

On the basis of positions of the division lines 14 detected in the alignment step, the chuck table 32 is moved to a position directly below the laser beam applying unit 34, and the wafer 10 is disposed in such a predetermined position that the division lines 14 of the wafer 10 extend along the X-axis direction. The laser beam LB is then applied to the wafer 10 from the laser beam applying unit 34 with its focal point positioned inside the wafer 10 along a predetermined one of the division lines 14 while, at the same time, the chuck table 32 is moved in the X-axis direction, so that a modified layer 100 is formed along the division line 14. The laser processing for forming the modified layer 100 described above will be described in detail below.

Figure 3A:
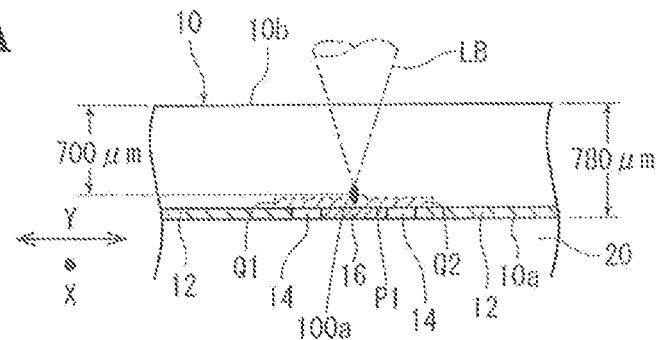
FIG. 3A is a partially enlarged sectional view of the wafer at the time of forming a first modified layer when the modified layer forming step illustrated in FIG. 2B is performed.

In order to form the modified layer 100 in the modified layer forming step, first, as illustrated in FIG. 3A, a center of a focal point P1 of the laser beam LB is positioned inside the wafer 10 at a position corresponding to a predetermined division line 14, the position being closer to the front side 10a on which the TEG 16 is formed, for example, the position being at a depth of 700 μm from the back side 10b. The laser beam applying unit 34 is then operated to apply the laser beam LB of the wavelength having a transmitting property to the wafer 10 including Si while, at the same time, the chuck table 32 is moved in the direction indicated by the arrow X illustrated in FIG. 2B (a direction perpendicular to the sheet plane of FIG. 3A), thereby forming a first modified layer 100a. Since the focal point of the laser beam LB applied from the laser beam applying unit 34 is elongated in a thickness direction (depth direction) of the wafer 10 because of spherical aberration of the optical system included in the laser beam applying unit 34, the first modified layer 100a formed inside the wafer 10 has a certain length in the thickness direction. It is to be noted that, as illustrated in FIG. 3A, circuit information sections Q1 and Q2 each including wiring connecting the TEG 16 disposed along the division line 14 and the device 12 to each other are formed inside the wafer 10 at positions near the front side 10a.

The focal point of the laser beam LB applied from the laser beam applying unit 34 according to the present embodiment has a spot S in the form of an ellipse a major axis of which extends in a direction along the division line 14 as illustrated in an enlarged manner in a right upper portion of FIG. 2B. The spot S of the focal point of the laser beam LB can be made in such an elliptical shape by, for example, providing a beam expander and an elliptical beam shaper (both not illustrated) in the optical system that transmits the laser beam LB. The beam expander expands a small circular spot formed at the time when the laser beam LB is focused at the focal point into a large circular spot, and the expanded circular spot is deformed into an elliptical shape by the elliptical beam shaper.

It is to be noted that the modified layer forming step according to the present embodiment is performed, for example, under the following laser processing conditions.

Wavelength: 1,342 nm
Repetition frequency: 60 kHz
Average output: 1.6 W
Processing-feed speed: 300 mm/s
Focal point position (depth): 700 μm (P1), 500 μm (P2), 300 μm (P3)

Figure 3B:
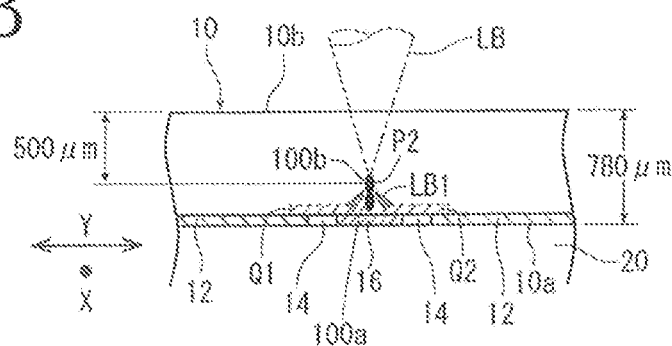
FIG. 3B is a partially enlarged sectional view of the wafer at the time of forming a second modified layer.

After the first modified layer 100a is formed in the above-described manner, a center of a focal point P2 of the laser beam LB is positioned inside the wafer 10 at a position corresponding to the predetermined division line 14 where the first modified layer 100a has been formed, the position being close to the position of the first modified layer 100a, for example, the position being at a depth of 500 μm from the back side 10b as illustrated in FIG. 3B. In this case, the laser beam LB is applied such that the focal point P2 of the laser beam LB partially overlaps the first modified layer 100a that has been formed while, at the same time, the chuck table 32 is moved in the direction indicated by the arrow X illustrated in FIG. 2B (a direction perpendicular to the sheet plane of FIG. 3B), thereby forming a second modified layer 100b. In this manner, the laser beam LB is applied such that the focal point P2 partially overlaps in a vertical direction the first modified layer 100a that has been formed, resulting in that the laser beam LB is scattered by the first modified layer 100a to form a scattered light LB1 oriented outward of the first modified layer 100a as illustrated in FIG. 3B. The scattered light LB1 is applied to the circuit information sections Q1 and Q2 each including the wiring connecting the TEG 16 and the device 12 to each other, so that the circuit information sections Q1 and Q2 are destroyed. It is to be noted that an average output of the laser beam LB applied here is set in such a range that the second modified layer 100b is formed inside the wafer 10 along the division line 14, the circuit information sections Q1 and Q2 are destroyed by the scattered light LB1, and only the regions inside the wafer 10 along the division line 14 are destroyed, so that the devices 12 are not damaged.

Figure 3C:
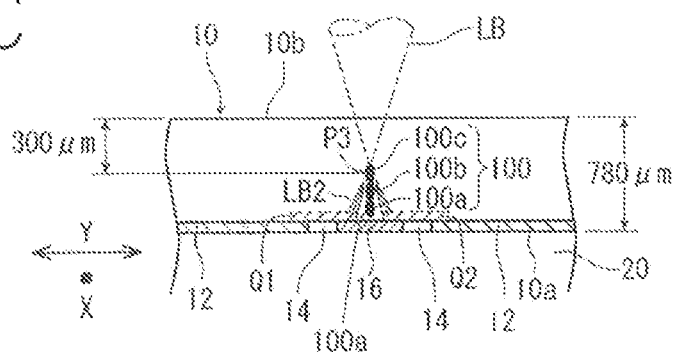
FIG. 3C is a partially enlarged sectional view of the wafer at the time of forming a third modified layer.

After the second modified layer 100b is formed in the above-described manner, a center of a focal point P3 of the laser beam LB is positioned inside the wafer 10 at a position corresponding to the predetermined division line 14 where the first modified layer 100a and the second modified layer 100b have been formed, the position being close to the position of the second modified layer 100b, for example, the position being at a depth of 300 μm from the back side 10b as illustrated in FIG. 3C. Then, the laser beam LB is applied such that the focal point P3 of the laser beam LB partially overlaps the second modified layer 100b while, at the same time, the chuck table 32 is moved in the direction indicated by the arrow X illustrated in FIG. 2B (a direction perpendicular to the sheet plane of FIG. 3C), thereby forming a third modified layer 100c. In this manner, the laser beam LB is applied such that the focal point P3 partially overlaps in the vertical direction the second modified layer 100b that has been formed, resulting in that the laser beam LB is scattered by the second modified layer 100b to form a scattered light LB2 oriented outward of the second modified layer 100b. The scattered light LB2 also reaches the circuit information sections Q1 and Q2 each including the wiring connecting the TEG 16 and the device 12 to each other, so that the circuit information sections Q1 and Q2 are further destroyed. An average output of the laser beam LB applied here is set in such a range that the third modified layer 100c is formed, the circuit information sections Q1 and Q2 are destroyed, and only the regions inside the wafer 10 along the division line 14 are destroyed, so that the devices 12 are not damaged.

Figure 4:
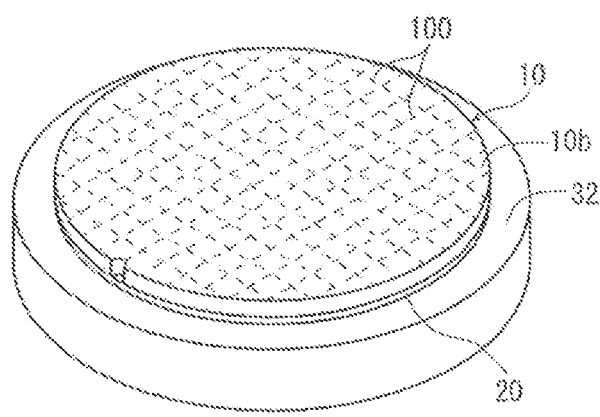
FIG. 4 is a perspective view of the wafer in which modified layers have been formed.

The modified layer forming step is performed in the manner described above to form the modified layer 100 including the first modified layer 100a, the second modified layer 100b, and the third modified layer 100c inside the wafer 10 along the predetermined division line 14, so that the circuit information sections Q1 and Q2 each including the wiring connecting the TEG 16 formed along the predetermined division line 14 and the device 12 to each other are destroyed. After the modified layer 100 is formed along the predetermined division line 14 in this manner, the chuck table 32 is moved to move (index-feed) the position at which the laser beam LB is applied in the Y-axis direction indicated by the arrow Y illustrated in FIG. 2B. Another modified layer 100 is then formed for an unprocessed division line 14 adjacent to the predetermined division line 14 in the same manner, so that the circuit information sections Q1 and Q2 related to the TEG 16 formed along the division line 14 are destroyed. Similarly, modified layers 100 are formed along all the division lines 14 extending in parallel with the predetermined division line 14 and the relevant circuit information sections Q1 and Q2 are destroyed. The chuck table 32, together with the wafer 10 held thereon, is then rotated by 90 degrees, and the laser processing is similarly performed on all the division lines 14 extending in a direction perpendicular to the predetermined division line 14 so as to form the modified layers 100 and destroy the circuit information sections Q1 and Q2 related to the TEG 16 formed along the division lines 14 (see FIG. 4). Accordingly, the modified layer forming step is completed.

It is to be noted that, while the modified layer 100 includes the first modified layer 100a, the second modified layer 100b, and the third modified layer 100c in the modified layer forming step according to the embodiment described above, the present invention is not limited to this case. If, for example, the circuit information sections Q1 and Q2 are sufficiently destroyed by the first modified layer 100a and the second modified layer 100b, and if the wafer 10 can be divided in a dividing step to be described later with the modified layer 100 as a division starting point, the modified layer 100 may include only the first modified layer 100a and the second modified layer 100b. Alternatively, the modified layer 100 may include a further modified layer formed in addition to the first modified layer 100a, the second modified layer 100b, and the third modified layer 100c.

After the modified layer forming step described above is performed, the dividing step is performed in which an external force is applied to the wafer 10 so as to divide the wafer 10 into individual device chips with the modified layers 100 formed inside the wafer 10 along the division lines 14 as division starting points. The dividing step according to an embodiment is described below.

Figure 5A:
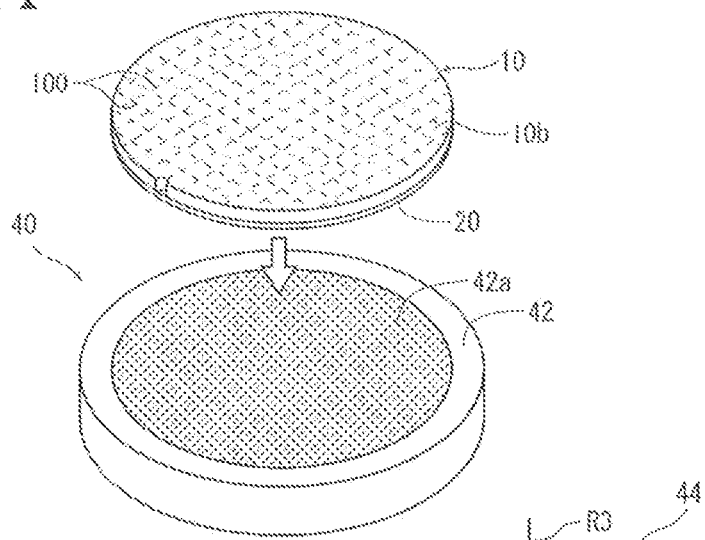
FIG. 5A is a perspective view illustrating a manner in which the wafer is placed on a chuck table of a grinding apparatus.

As illustrated in FIG. 5A, the wafer 10 with the modified layers 100 formed therein is transferred to a grinding apparatus 40 (partially illustrated) functioning as external force applying means, and the wafer 10 is placed on and held under suction by a holding surface 42a of a chuck table 42 disposed in the grinding apparatus 40 such that the back side 10b of the wafer 10 faces upward and the protective tape 20 faces downward.

Figure 5B:
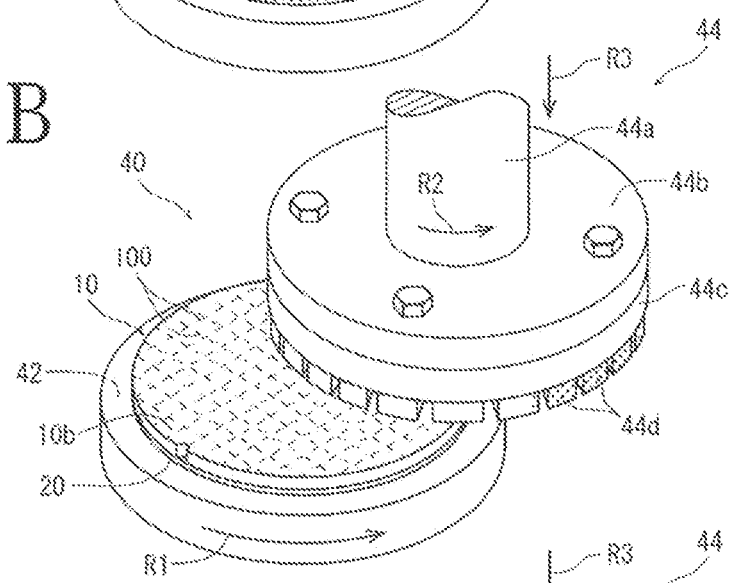
FIG. 5B is a perspective view illustrating a manner in which a dividing step is performed.

The grinding apparatus 40 includes a grinding unit 44 as illustrated in FIG. 5B. The grinding unit 44 includes a spindle 44a disposed in a rotatable manner and a servo motor (not illustrated) as a driving source for rotating the spindle 44a. The spindle 44a has a disc-shaped mount 44b disposed in a lower end portion thereof, and the mount 44b has a grinding wheel 44c disposed on a lower surface thereof. The grinding wheel 44c has a plurality of grinding stones 44d disposed annularly on a lower surface thereof.

Figure 5C:
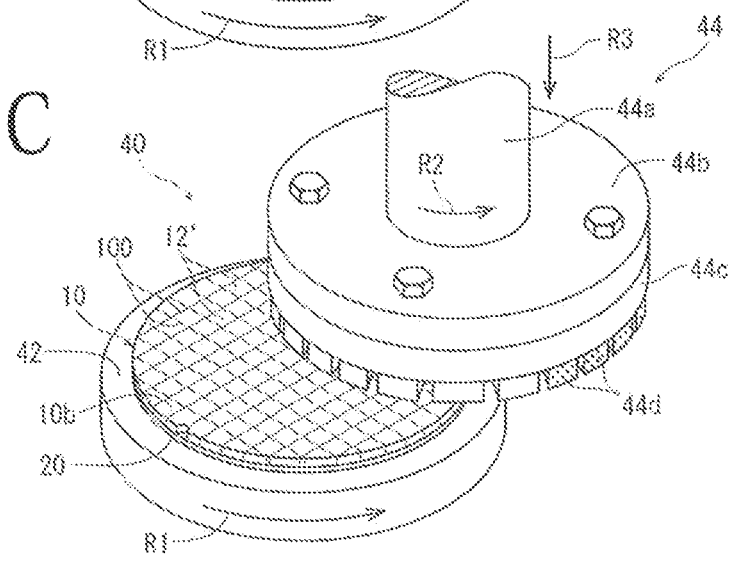
FIG. 5C is a perspective view illustrating a state in which the wafer has been divided into individual device chips by the dividing step.

In the dividing step according to the present embodiment, the wafer 10 held under suction by the chuck table 42 is positioned below the grinding unit 44 as illustrated in FIG. 5B. Then, while the chuck table 42 is rotated in a direction indicated by an arrow R1 at a rotational speed of, for example, 300 rpm, the spindle 44a is rotated in a direction indicated by an arrow R2 at a rotational speed of, for example, 6,000 rpm. Grinding-feed means not illustrated is then operated to lower the grinding unit 44 in a direction indicated by an arrow R3, thereby bringing the grinding unit 44 into contact with the back side 10b of the wafer 10. A grinding-feed speed at the time when the grinding stones 44d of the grinding unit 44 come contact with the back side 10b of the wafer 10 and grind the back side 10b is set to 0.1 µm/s, for example. The grinding processing is performed in this manner, so that the back side 10b of the wafer 10 is ground and an external force is applied to the wafer 10 as illustrated in FIG. 5C, to thereby divide the wafer 10 into individual device chips 12' along the division lines 14 with the modified layers 100 as the division starting points. Accordingly, the dividing step is completed.

Figure 6:
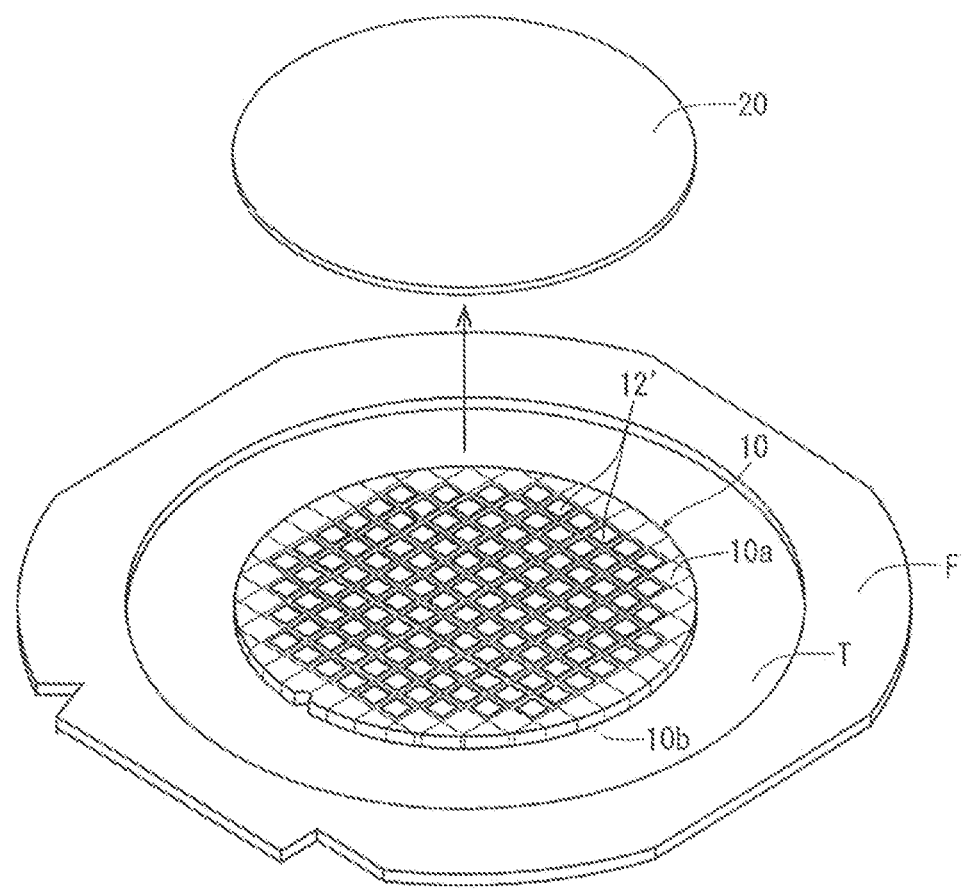
FIG. 6 is a perspective view illustrating a manner in which the protective tape is peeled off from the wafer after the dividing step.

After the dividing step is performed in the above-described manner, a tape changing step is performed, as needed, in which the protective tape 20 attached to the front side 10a of the wafer 10 is peeled off and an adhesive tape T is attached to and protect the back side 10b of the wafer 10. In the tape changing step, as illustrated in FIG. 6, an annular frame F having an opening that can accommodate the wafer 10 is prepared, the wafer 10 is positioned in the opening of the frame F such that the protective tape 20 faces upward, and the wafer 10 is held by the frame F through the adhesive tape T. With the back side 10b of the wafer 10 attached to the adhesive tape T, the protective tape 20 is peeled off from the front side 10a of the wafer 10. The wafer 10 that is held by the frame F and has the protective tape 20 peeled off therefrom is housed in accommodating means (a cassette, for example) not illustrated or directly transferred for a subsequent step (pick-up step, for example).

The dividing step in which an external force is applied to the wafer 10 to divide the wafer 10 into individual device chips with the modified layers 100 formed inside the wafer 10 along the division lines 14 as the division starting points is not limited to the embodiment described above and may be performed according to another embodiment described below.

Figure 7A:
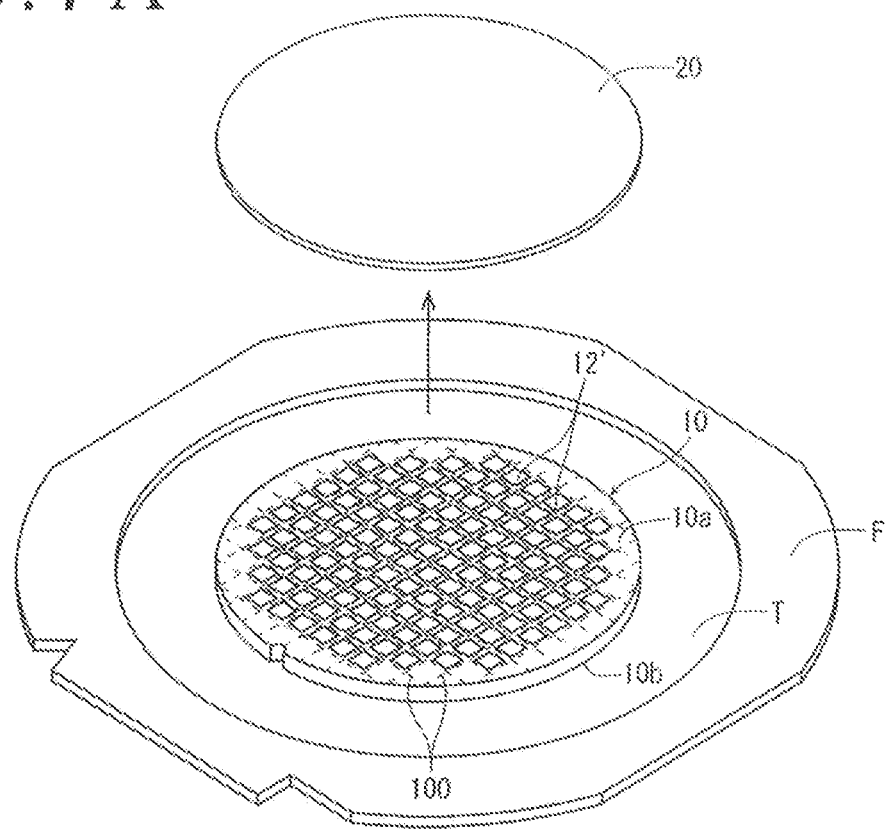
FIG. 7A is a perspective view illustrating a manner in which the protective tape is peeled off from the wafer in a dividing step according to another embodiment.
Figure 7B:
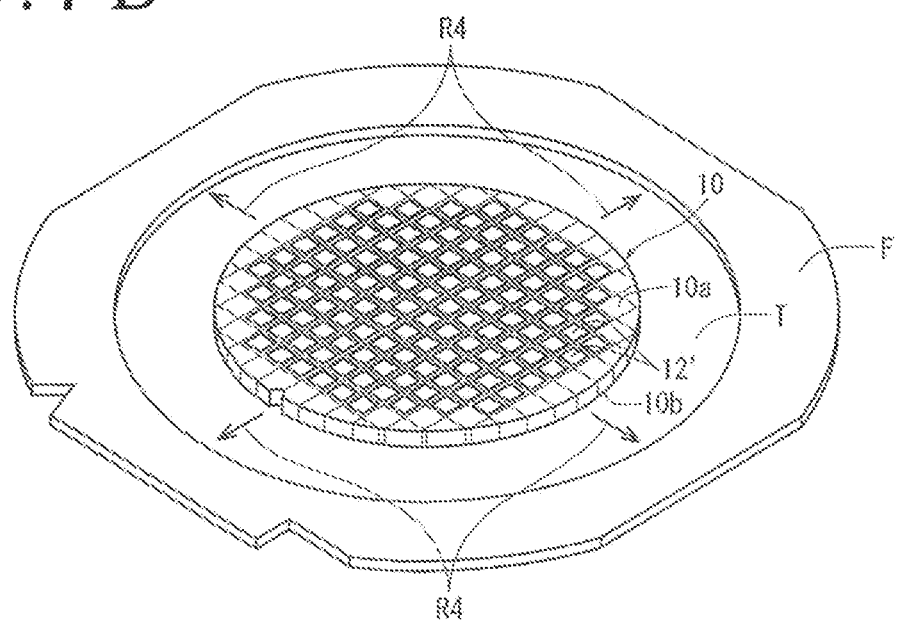
FIG. 7B is a perspective view illustrating a manner in which the wafer is divided into individual device chips through expansion of an adhesive tape holding the wafer.

In the dividing step according to the other embodiment, as illustrated in FIG. 7A, an annular frame F having an opening that can accommodate the wafer 10 is prepared, the wafer 10 is positioned in the opening of the frame F such that the protective tape 20 faces upward, and the wafer 10 is held by the frame F through the adhesive tape T. The protective tape 20 is then peeled off, and the adhesive tape T is expanded in directions indicated by arrows R4, so that the wafer 10 is divided into individual device chips 12' with the modified layers 100 formed inside the wafer 10 along the division lines 14 as the division starting points. Accordingly, the dividing step is completed. The individual device chips 12' obtained by dividing the wafer 10 are housed in accommodating means (a cassette, for example) not illustrated or transferred for a subsequent step (pick-up step, for example).

According to the embodiments described above, it is possible to destroy the circuit information sections Q1 and Q2 each including the wiring connecting the TEG 16 and the device 12 to each other while forming the modified layer 100 to be used as the division starting point, which improves the productivity.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer having devices formed on a front side thereof into individual device chips, the front side being partitioned by a plurality of crossing division lines having a testing metal pattern formed in part thereof into a plurality of regions where the respective devices are formed, the testing metal pattern being connected to a circuit information section, the wafer processing method comprising:

a wafer holding step of holding the wafer having the devices formed thereon on a chuck table such that the front side of the wafer is in contact with the chuck table and a back side of the wafer is exposed;

a first modified layer forming step of applying a laser beam of a wavelength having a transmitting property to the wafer with a focal point of the laser beam positioned inside the wafer at a first depth from the back side, thereby forming a first modified layer along a division line;

a second modified layer forming step of applying, after the first modified layer forming step is performed, the laser beam with the focal point thereof positioned at a second depth shallower than the first depth from the back side of the wafer, thereby forming a second modified layer along the division line; and a dividing step of applying an external force to the wafer after the first and second modified layer forming steps are performed, thereby dividing the wafer into individual device chips with the first and second modified layers formed inside the wafer along the division line as a division starting point, wherein, in the second modified layer forming step, the laser beam is applied with the focal point positioned at a position where the focal point partially overlaps the first modified layer that has been formed, so that the laser beam applied in the second modified layer forming step is scattered by the first modified layer, thereby destroying the circuit information section connected to the testing metal pattern.

2. The wafer processing method according to claim 1, wherein the focal point of the laser beam applied in each of the first and second modified layer forming steps has a spot in a form of an ellipse, and a major axis of the ellipse is positioned to extend in a direction along the division line.

* * * * *